United States Patent [19]

Hsieh

[11] Patent Number: 5,016,638

[45] Date of Patent: May 21, 1991

[54] VIBRATION CONTROL IN NMR MAGNET STRUCTURES

[76] Inventor: Chi H. Hsieh, 120 Juniper Ave., Ronkonkoma, N.Y. 11779

[21] Appl. No.: 317,296

[22] Filed: Mar. 1, 1989

[51] Int. Cl.$^5$ ............................................. A61B 5/055
[52] U.S. Cl. ................................ 128/653 A; 324/300; 324/309; 324/320
[58] Field of Search ............... 128/653; 324/300, 307, 324/309, 318–320

[56] References Cited

U.S. PATENT DOCUMENTS

| | | | |
|---|---|---|---|
| 4,571,568 | 2/1986 | Grangereau | 324/320 |
| 4,639,672 | 1/1987 | Beaumont | 324/319 |
| 4,646,045 | 2/1987 | Chari et al. | 324/320 |
| 4,675,609 | 6/1987 | Danby et al. | 324/319 |
| 4,707,663 | 11/1977 | Minkoff et al. | 324/319 |
| 4,758,812 | 7/1988 | Forster et al. | 324/320 |
| 4,766,378 | 8/1988 | Danby et al. | 324/319 |

Primary Examiner—Lee S. Cohen
Assistant Examiner—John D. Zele
Attorney, Agent, or Firm—Lerner, David, Littenberg, Krumholz & Mentlik

[57] ABSTRACT

A medical NMR scanner adapted to be supported on the floor of a building or other structure by vibration limiting supports is disclosed. The scanner includes a frame defining a patient-receiving space adapted to receive a human body. It also includes a pair of opposed polar regions aligned on a polar axis. The polar regions are disposed on opposite sides of the patient-receiving space. Structure is provided in each of the polar regions for producing a magnetic field within the patient-receiving space. Attenuators, positioned intermediate the frame and the building floor, are provided for attenuating transmission of vibrations from the floor to the magnetic field producing structure in order to reduce scanner image degradation.

16 Claims, 4 Drawing Sheets

VIBRATION CONTROL IN NMR MAGNET STRUCTURES

BACKGROUND OF THE INVENTION

The present invention pertains to medical nuclear magnetic resonance scanners, and, more particularly, to the use of vibration isolators in connection therewith to prevent degradation of scanner images due to vibration of the magnet structure caused by external influences.

Since the invention of the medical nuclear magnetic resonance (NMR) scanning technique by Dr. Raymond Damadian, as set forth in U.S. Pat. No. 3,789,832, this technique has been widely adopted in the medical arts. Medical NMR scanning requires creation of a substantial constant "primary" magnetic field passing through the patient's body. Additional "gradient" magnetic fields varying with time typically are superimposed on the primary field. The patient is exposed to radio frequency electromagnetic waves which also vary with time in particular patterns. Under the influence of the magnetic fields and the radio waves, certain atomic nuclei within the patient's tissues resonate and emit further radio waves. By mathematical techniques involving correlation of the magnetic field patterns in use at various times with the radio frequency waves emitted, it is possible to determine the amounts and physical states of particular atomic nuclei at various locations within the patient's body. This information typically is displayed as an image with shadings corresponding to the concentration and/or physical state of certain chemical substances of interest. These parameters ordinarily differ for differing kinds of tissues. Thus, the image created by NMR techniques permits the physician to see organs and soft tissues within the body, and also permits the physician to see abnormalities, such as tumors, within the body. Accordingly, NMR scanning and imaging techniques are being adopted rapidly by physicians.

Medical NMR scanning imposes certain challenging technical requirements for the apparatus. The primary magnetic field must be a strong field, typically on the order of about 1 kilogauss or more and often more than about 10 kilogauss (1 Tesla), far stronger than the magnetic fields associated with common magnets. Moreover, the primary magnetic field must be precisely configured. Thus, the primary field, before application of the gradient fields, should be uniform and constant to at least about 1 part in 1,000, and preferably at least about 1 part in 10,000 or better, in order to provide a useful image. Even better uniformity is more desirable. This uniform and constant primary magnetic field must be maintained over a region of the patient's body large enough to provide medically useful information, typically over the scanning region encompassing a major portion of the cross section through the patient's torso. Further, the magnetic field apparatus typically must be arranged to receive the patient's body, and hence must provide openings large enough for the patient's body to fit within the apparatus. All these requirements, taken together, pose a formidable technical problem.

Two distinct and fundamentally different approaches to these requirements are currently employed in construction of medical NMR scanners. As set forth in commonly assigned U.S. Pat. No. 4,675,609 to Danby et al., magnetic field producing means such as permanent magnets can be combined with a ferromagnetic metal frame and other components to form a magnetic assembly which provides the primary field. The disclosure of said U.S. Pat. No. 4,675,609 is hereby incorporated by reference herein. Medical NMR scanners incorporating magnetic assemblies according to U.S. Pat. No. 4,675,609 have excellent primary fields and hence offer good scanning capabilities.

Additional configurations of primary field magnets employing electromagnetic coils as flux-producing elements in conjunction with ferromagnetic frames are disclosed in commonly assigned U.S. Pat. No. 4,766,378 to Danby et al., the disclosure of which is hereby incorporated by reference herein. These coils may be formed from superconducting materials to maximize the current-carrying capacity of the coils and thereby maximize the field strength. Other primary field magnets utilizing superconducting coils without ferromagnetic frames have also been employed. The primary field magnet structures utilized in typical NMR scanners are massive devices. Thus, the ferromagnetic frames and permanent magnets according to either of the aforementioned patents typically weigh many tons. These massive magnet assemblies ordinarily are mounted on the floor of a building. Alternatively, the magnet assembly may be secured to the frame of a heavy truck which can be parked at a hospital or other institution where the scanner is to be operated.

Modern NMR scanners have been developed to the point where they provide images of extraordinary quality. It has long been recognized that movement of the patient relative to the scanning equipment during the procedure can degrade the image. It has further been recognized that external magnetic fields and magnetic field disturbances caused by ferromagnetic materials in the vicinity of the scanner can substantially degrade the image quality. Considerable efforts have been devoted heretofore towards alleviating these effects. Thus, particular sequences of radio frequency excitation signals and magnetic field gradient have been developed which substantially compensate for motion of the patient. Also, primary field magnets which resist external influences to a substantial degree have been developed. For example, the magnet assemblies according to the aforementioned '609 and '378 patents effectively isolate the patient receiving space from any external field influences by virtue of the ferromagnetic frames incorporated in such assemblies.

Despite all of the improvements made to NMR scanning apparatus and techniques heretofore, however, there has still been a need for further improvements. It has been found that an NMR scanning apparatus installed at one location does not provide the same performance as equivalent apparatus installed at another location. Thus, two scanning units of identical design installed at two different locations may produce images of different quality. A scanner at one location may provide perfectly good images, whereas the images provided by an ostensibly identical scanner installed at another location may be of significantly lower quality. These quality variations have persisted to some extent despite intensive efforts to identify and eliminate known causes of image degradation such as patient movement and external magnetic field disturbances. Thus, prior to the present invention it has been the practice to simply accept the somewhat poorer images produced by some machines at some locations. Accordingly, there has been a need heretofore for further improvements in NMR scanners which would eliminate these unexplained variations and bring all the scanners at all locations up to the image quality standards heretofore provided by only those machines at the best locations.

One aspect of the present invention incorporates the discovery that these unexplained variations in image quality are due at least in part to mechanical vibrations transmitted to the scanning apparatus through the base structure on which the scanner is mounted. Thus, according to the present invention it has been found that where an NMR medical scanning apparatus is installed in a building or other environment subject to vibration either of a continuous nature (e.g., from rotating machinery such as components of air conditioning equipment located in nearby spaces) or of a transitory nature (e.g., from shocks, impulses or vibrations caused by trucks or trains passing the vicinity of the building), the image degrades, apparently due to vibration of the magnet structure. The relationship between such image degradation and external vibration sources had not been associated heretofore as the magnet structures typically weigh many tons, and hence would not be able to vibrate to any substantial degree. Accordingly, the discovery of such relationship was quite surprising and unexpected.

Although the present invention is not limited by any theory of operation, it is believed that vibration of the magnet structure may cause relative movement of ferromagnetic elements in the magnetic flux path. For example, in a permanent magnet structure incorporating a plurality of magnetic blocks, vibration of the magnet structure may cause minute movements of these blocks. Likewise, in a magnet structure incorporating a magnetically permeable, ferromagnetic frame, vibrations may cause minute movements of frame elements relative to one another and may also cause movement of the magnetic flux producing elements relative to the frame. Thus, the permanent magnets or electromagnets used with such a frame may move slightly relative to the frame. Any of these various types of relative movement may cause subtle changes in the magnetic flux path and hence may cause changes in the magnetic field applied to the patient by the primary field magnet. Such changes occurring during the scanning cycle would disrupt the imaging process and degrade the image. Regardless of the theory of operation, it has been found, according to the present invention, that the performance of NMR scanning apparatus can be materially enhanced by isolating the magnetic field producing elements, and desirably the frame as well, from externally applied transitory and continuous vibrations. The performance enhancements provided by such isolation are particularly significant where the magnetic field producing elements incorporate a plurality of permanent magnets and where the frame incorporates a plurality of juxtaposed magnetic elements providing a flux path and carrying magnetic flux to or from the patient receiving space.

It is, thus, apparent that there has heretofore been a significant but unrecognized need to provide medical NMR scanners in which image degradation is overcome by minimizing the introduction of external vibrations into the interior of the scanners. The present invention provides NMR scanners which meet that need.

SUMMARY OF THE INVENTION

One aspect of the present invention provides a medical NMR scanner that is adapted to be supported on a floor of a building, truck or other structure and includes a frame defining a patient-receiving space. The frame includes a pair of opposed polar regions aligned on a polar axis and disposed on opposite sides of the patient-receiving space. The scanner also includes means for producing a magnetic field within the patient receiving space. The scanner is also provided with means for attenuating transmission of vibrations from the floor to the magnetic field producing means in order to reduce scanner image degradation.

According to another aspect of the present invention, the vibration transmission minimizing means includes a resilient material positioned intermediate the frame and the floor of the structure supporting the scanner.

According to further aspects of the invention, the vibration transmission attenuating means further includes a rigid base member, on which the resilient member fixedly is positioned and which in turn rests on the supporting structure floor, and a metal top plate member having its lower surface fastened to the top surface of the resilient member and its upper surface adapted to fixedly support the scanner frame thereon.

The foregoing features serve to reduce image degradation in NMR scanners and, thus, the present invention offers considerable improvement in medical NMR scanning apparatus.

The use and other objects, features and advantages of the present invention will be more readily apparent from the detailed description of the preferred embodiments set forth below, taken in conjunction with the accompanying drawings.

DESCRIPTION OF THE PREFERRED EMBODIMENT

Figure 1:
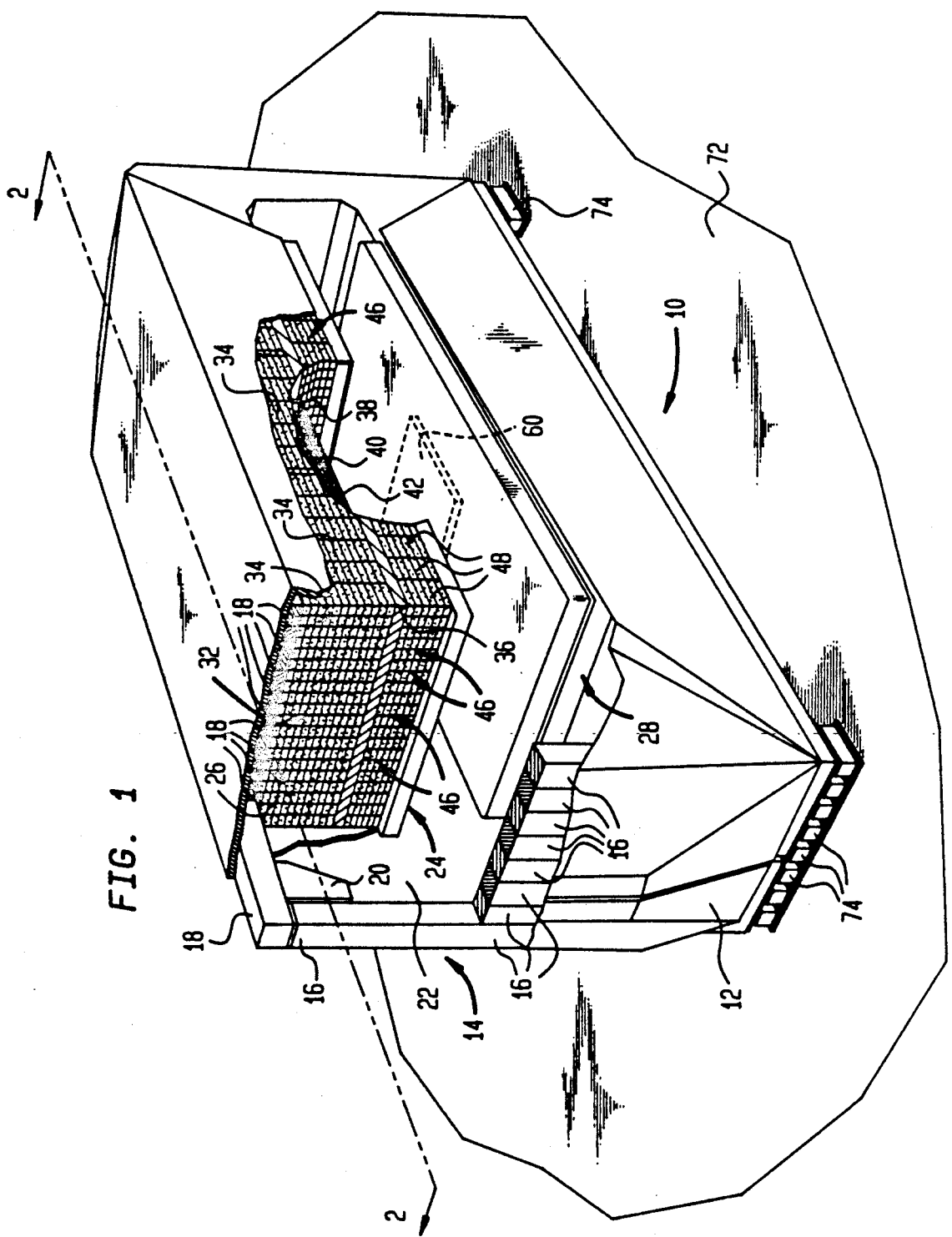
FIG. 1 is a partially broken away perspective view of NMR apparatus having a permanent magnet configuration and employing means for minimizing transmission of vibrations from the building floor to the magnetic field producing means of the scanner.

Referring to the figures, and more particularly to FIG. 1 thereof, there is illustrated therein a permanent magnet construction 10 of a nuclear magnetic resonance scanning and imaging apparatus.

The permanent magnet construction 10 is substantially in accordance with the aforesaid U.S. Pat. No. 4,675,609 and includes a housing 12 which encloses the components of the magnet 10. The supporting structure of the magnet 10 is a frame 14 constructed of a plurality of magnetizable steel or iron girders 16 and 18. The steel girders 16 and 18 are assembled with the aid of corner pieces 20 to form a plurality of substantially rectangular structures which are drawn together side by side to form the frame 14. Frame 14 defines an opening 22 formed by the girders 16 and 18.

Although the girders 16 and 18 are illustrated in a particular configuration, it is to be understood that other assemblies or structures can be employed to fabricate the desired frame structure and, for instance, the structure could be constructed of four rectangular plates or other similar configurations to produce a frame having an opening therein for the mounting of the balance of the components of the magnet construction 10.

Figure 2:
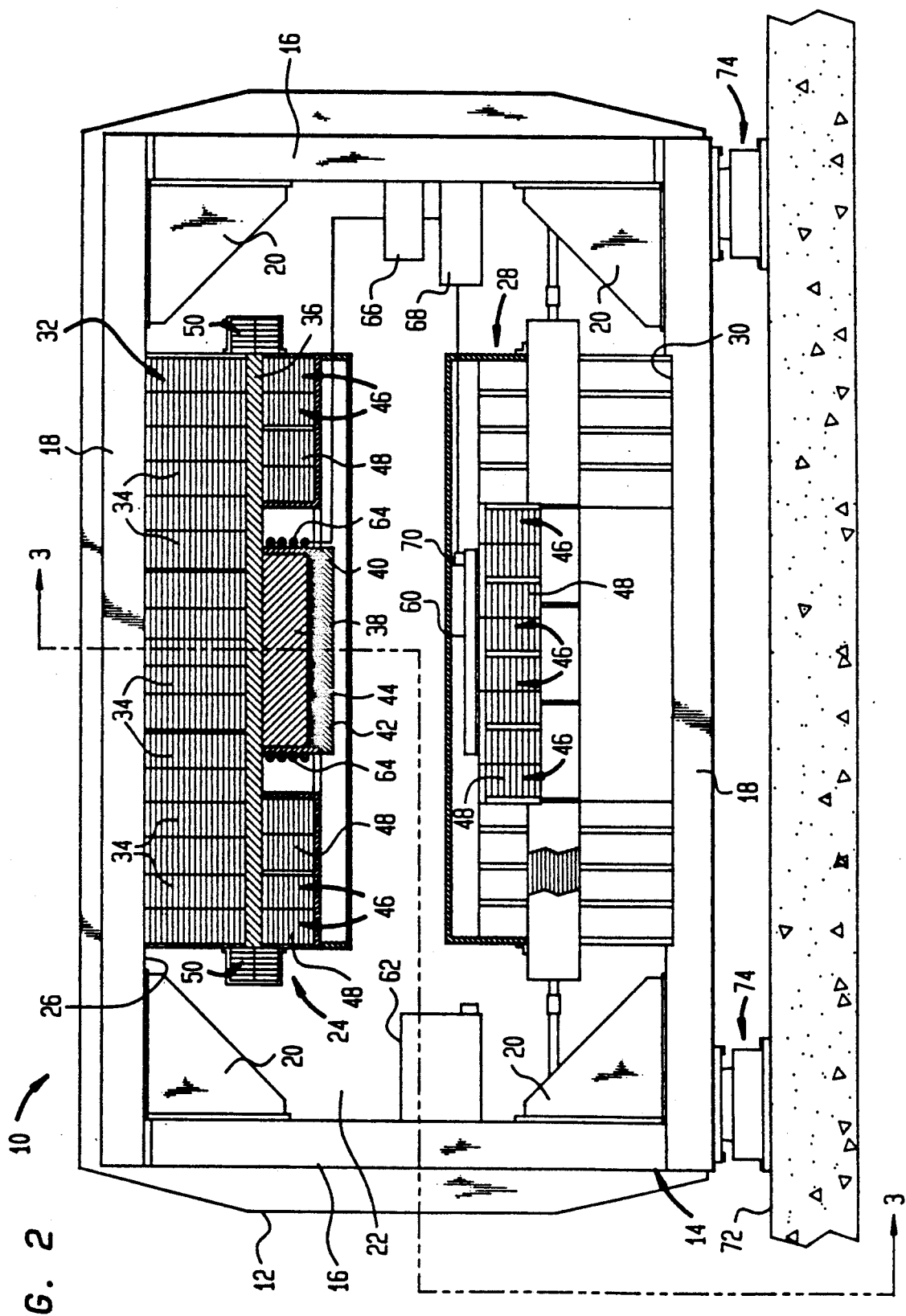
FIG. 2 is an enlarged cross sectional view of the apparatus, taken along the line 2—2 of FIG. 1.
Figure 3:
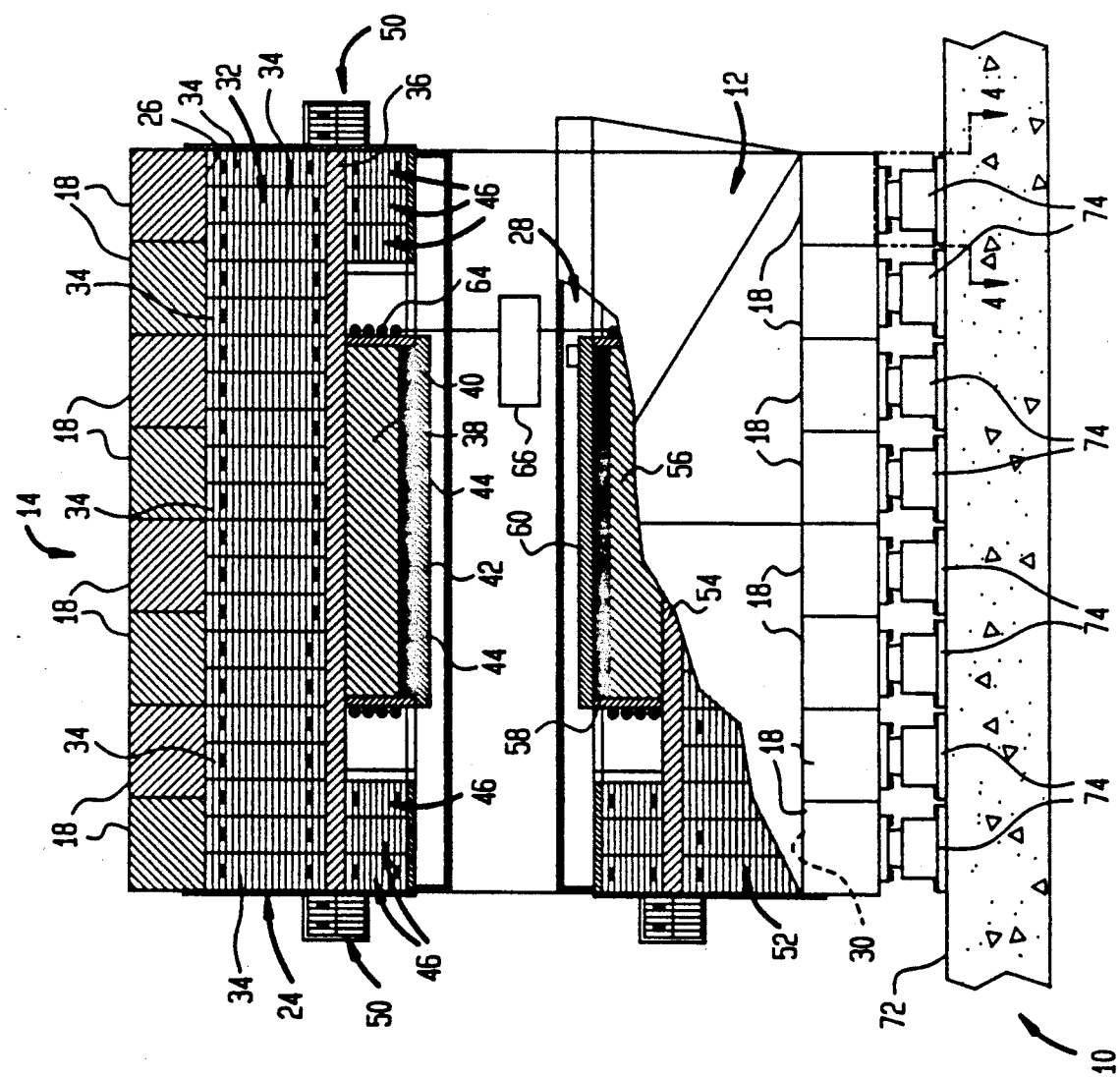
FIG. 3 is a partially broken away cross section view, taken along the line 3—3 of FIG. 2.

With reference to FIGS. 1, 2 and 3, the permanent magnet construction 10 can be seen to include a first magnet structure 24 disposed adjacent to an interior first surface 26 of the frame 14, within the opening 22 thereof, and a second magnet structure 28 disposed adjacent to an interior second surface 30 of the frame 14.

Further shown in FIGS. 1 and 2, and as best illustrated in FIG. 3, the first magnet structure 24 and the second magnet structure 28 are essentially identical, as will be hereinafter described. The first magnet structure 24 includes an assembly 32 of relatively low energy flux magnetic material which comprises a plurality of low energy flux magnets such as ceramic magnet 34 or the like. The ceramic magnets 34 are arranged in rows and columns in a stacked matrix configuration, with appropriate polarity orientation, so that the magnetic strength thereof is aggregated.

A plate 36 which serves as a means for conducting magnetic flux is disposed adjacent to the first assembly 32 of relatively low energy flux magnetic material such that magnetic material thereof is sandwiched between the plate 36 and the first surface 26 of frame 14. The plate 36 is magnetically conductive and can be constructed of magnetic steel and the like. The plate 36 serves to concentrate magnetic flux of the first assembly 32 of relatively low energy flux material therein. This flux is conducted through the plate 36 and concentrated into an auxilary conducting plate 38 in contact with a first assembly 40 of relatively high energy flux magnetic material. The plates 36 and 38 can be of integral or unitary construction. The first assembly 40 of relatively high energy flux material is bounded on one side thereof by the auxiliary conducting plate 38 and on the other side by a first pole piece 42.

The first assembly 40 of relatively high energy flux magnetic material comprises a plurality of rare earth magnets 44 which are arranged in rows and columns in a stacked configuration. Any suitable rare earth material can be employed and, for this particular application, rare earth magnet bricks of a material called MISH metal has been employed.

The ceramic magnets 34 and the rare earth magnets 44 are each formed of bricks approximately four inches by six inches by one inch. In order to mount the magnets of the assemblies of relatively high and low energy flux magnetic material, suitable non-magnetic material such as aluminum can be employed. The polarity of each of the rare earth magnets 44 is observed in assembling the first assembly 40 of relatively high energy flux magnetic material.

By virtue of the combination of the first assembly 32 of relatively low energy flux magnetic material and the first assembly 40 of relatively high energy flux magnetic material with the plates 36 and 38, the magnetic flux of both these assemblies 32 and 40 is concentrated at the pole piece 42.

In order to reduce leakage from the plate 36 and the auxiliary conducting plate 38, stacks 46 of ceramic magnets 48 with their polarity reversed relative to the first assembly 32 of relatively low energy flux magnetic material are provided.

The polarity of the magnets in the assemblies 32 and 40 and in the stacks 46 is such that the upper face of each of the bricks is one pole of the magnet and the lower face of each of the bricks is another pole of the magnet. The bricks are stacked in a manner known in the art, such that the negative pole of one brick contacts the positive pole of the next brick in each stack. When the bricks are of reverse polarity, each stack is still in the same configuration but the upper and lowermost poles of the stack are reversed relative to the other stacks. In order to further reduce leakage of magnetic flux from the plate 36, a band 50 of stacked ceramic magnets is disposed about the peripheral edge thereof.

The volume of the first assembly 32 of relatively low energy flux magnetic material is much greater than the volume of the first assembly 40 of relatively high energy flux magnetic material. Essentially, the assembly 30 provides a base level magnetic strength and the assembly 40 adds to that base level in a cost effective manner.

The second magnet structure 28 is virtually identical to the first magnet structure 24 and includes a first assembly 52 of relatively low energy flux magnetic material, a plate 54, an auxiliary conducting plate 56, a second assembly 58 of relatively high energy flux magnetic material and a second pole piece 60. The plate 54 sandwiches the second assembly 52 of relatively low energy flux magnetic material between itself and the second surface 30 in the frame 14. The auxiliary conducting plate 56 is mounted adjacent to the plate 54 and the second assembly 58 of relatively high energy flux magnetic material is sandwiched between the auxiliary conducting plate 56 and the second pole piece 60. Shielding bricks similar to stacks 46 and band 50 of the first magnet structure 24 are also provided.

The magnetic flux developed between the first and second pole pieces 42 and 60 in an apparatus constructed in accordance with the principles of the present invention is approximately 3000 gauss and is stable to one part in 10,000 over a radius of 8 inches. Of course, if a desired flatness is not achieved, for instance a flatness better than one part in 1,000 over a 10 inch diameter, through the configuration of the magnets alone, it is to be understood that electromagnetic shim coils can be used to further flatten the field by placement of these coils over the pole pieces. The hereinbefore discussed combination of relatively low energy flux magnetic material and relatively high energy flux magnetic material permits the achievement of the noted magnetic strength and flatness at an economically feasible cost and in an area the size of which is practical.

Of course, in addition to the provision of the primary magnetic field between the first and second pole pieces 42 and 60, an rf field source and a detector for detecting nuclear magnetic resonance must also be provided. However, since these are well known in the art, they have not been illustrated.

When a body is to be imaged, it is moved into the magnetic field created between the first pole piece 42 and the second pole piece 60 by any suitable means well known in the art. When the permanent magnet construction 10 is employed in an NMR apparatus it has been found to be desirable to work at a frequency of 12 MHz. It is known that permanent magnets drift as a result of changes in temperature. The drift of the magnet construction 10 has been held to less than 10 Hz per hour by temperature regulation of the interior of the housing 12. This temperature regulation is accomplished by a heater 62 of the forced air type, disposed within the housing 12. The heater senses the temperature via a thermistor (not shown) disposed in one of the bricks and circulates heated air within the housing to maintain a desired temperature. For instance, a temperature of 77 degrees Fahrenheit has been employed.

In addition to maintaining the temperature within the housing 12, further stability has been achieved by wrapping of coils around the rare earth brick magnets and inducing current in these coils. For instance, a coil 64 is illustrated disposed around the first assembly of relatively high energy flux magnetic material 40. The magnetic assembly 40 is disposed adjacent pole piece 42. The coil 64 is coupled to a power supply 66 which in turn is controlled by a control means 68. Control means 68 monitors NMR sample 70 (FIG. 2) within the primary magnetic field created by the first and second pole pieces 42 and 60. The frequency of the NMR sample is determined by the control means 68. The control means 68 preferably employs a relatively standard microprocessor to process data and issue control instructions, such instrumentation control being well known to those of ordinary skill in the art.

Referring more particularly now to FIGS. 2-5, the frame 14 is supported on the floor 72 of the building or other structure in which the scanner is enclosed by means of a plurality of vibration isolators, attenuators or supports 74. Supports 74 serve as a means for attenuating transmission of vibrations from the building floor to the permanent magnet construction 10 in order to reduce degradation of the images produced by the scanner. The supports 74 are preferably positioned at opposite ends of the frame 14, beneath girders 18 and in alignment with the girders 16. In the embodiment shown, there is one support 74 positioned beneath and in alignment with each of the girders 16. As will appear in greater detail below, the supports 74 are preferably bolted to the undersurface of the girders 18 and to the floor 72, the latter preferably being of reinforced concrete construction to better support the heavy magnetic scanner construction.

Figure 4:
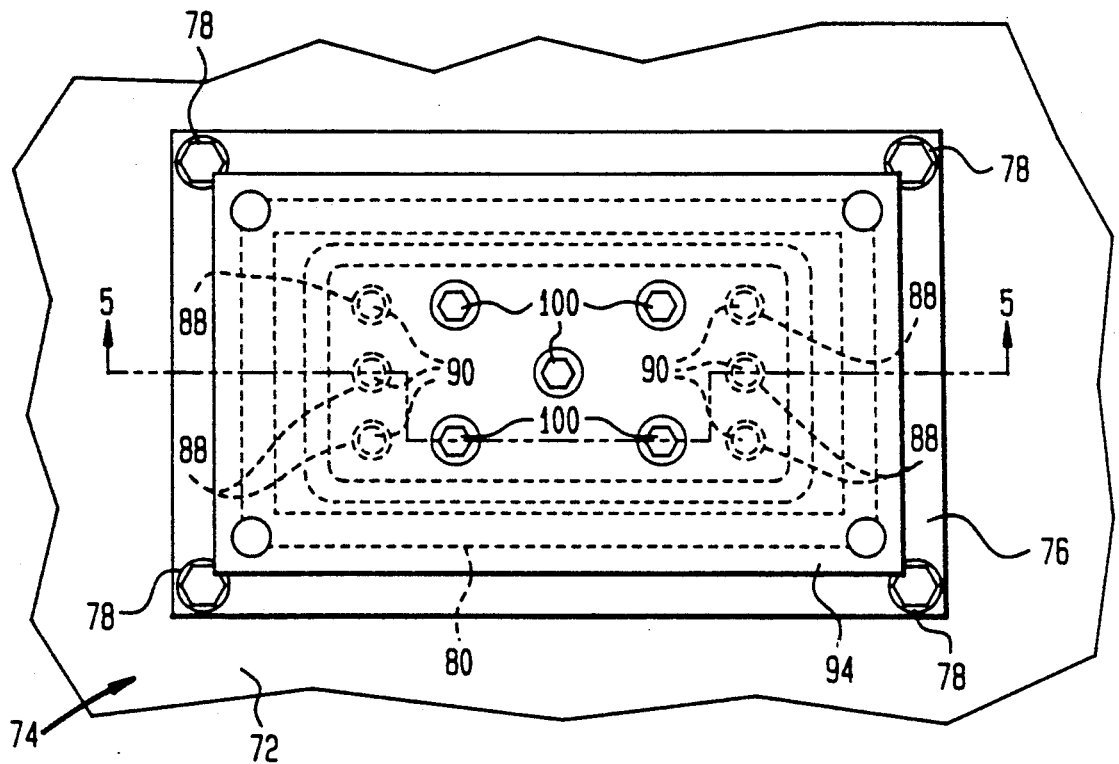
FIG. 4 is an enlarged plan view, taken along the line 4—4 of FIG. 3.
Figure 5:
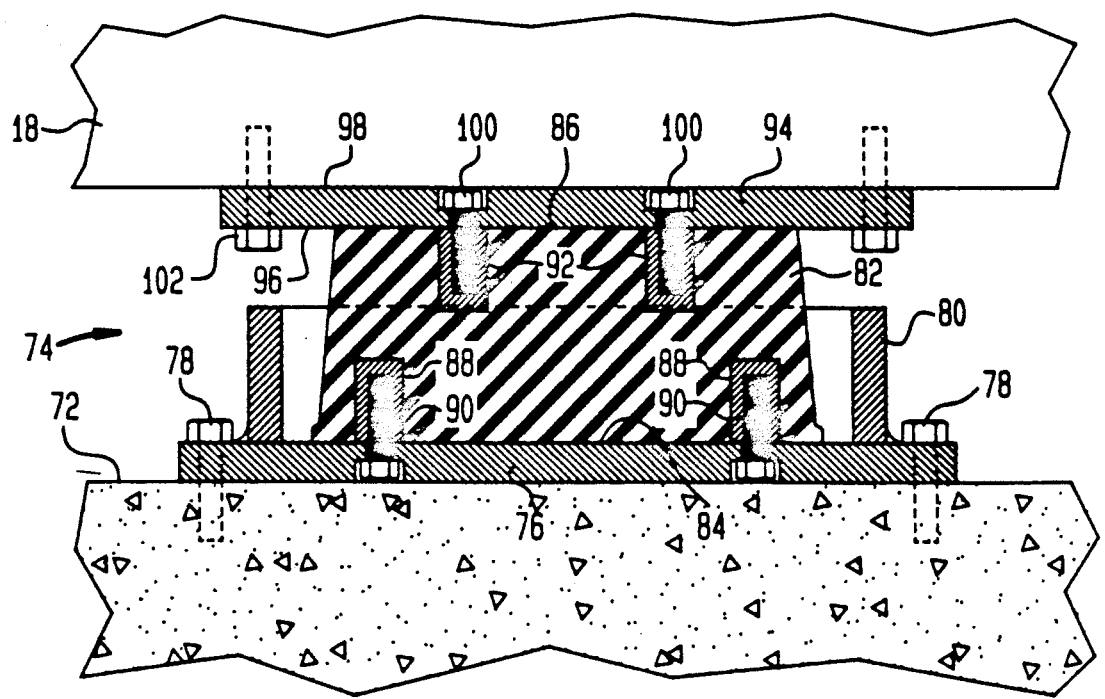
FIG. 5 is a sectional elevation view, taken along the line 5—5 of FIG. 4.

Referring more particularly now to FIGS. 4 and 5, one of the supports 74 has there been illustrated in greater detail, on an enlarged scale. The following description of the support 74 will be understood to be applicable to the remaining supports 74 illustrated in FIGS. 2 and 3. As shown in FIG. 5, the support 74 is positioned intermediate the floor 72 and a girder 18. The support 74 includes a rigid base member 76 that is fastened to the floor 72 by bolts 78. The base member 76, which is preferably of steel, is provided with a tubular metal wall 80 that is welded or otherwise fixed to the upper surface thereof. The upper surface of base member 76 also has fixed thereto a block 82 of resilient material, for example an elastomeric material such as rubber having a Shore A hardness of about 70 durometer. Block 82 is preferably in the form of a truncated rectangular pyramid having parallel lower and upper surfaces 84 and 86, respectively. Block 82 is preferably molded with threaded metal inserts 88 adhered therein adjacent the lower surface 84 so that the block 82 may be fastened to the upper surface of base member 76 via threaded bolts 90. Similar threaded inserts 92 are molded into block 82 adjacent the upper surface 86 of the block. A metal top plate member 94 having lower and upper surfaces 96 and 98, respectively, is fastened to the upper surface 86 of block 82 via bolts 100. The upper surface 98 of upper plate 94, in turn, supports one of the girders 18 thereon and is bolted to the girder by means of bolts 102.

The height of the tubular metal wall 80 surrounding block 82 is preferably greater than one-half of, but less than all of, the height of the block 82, so that there is no metal-to-metal contact between the lower surface 96 of top plate 94 and the top of tubular wall 80 during operation of the scanner. The tubular wall 80 preferably closely surrounds the block 82 so that in the event of catastrophic sidewise movement of the scanner relative to the floor 72, for example in the event of an earthquake or other major scanner shifting incident, the wall 80 will be abutted by the sides of the block 82 to reinforce the block 82 and inhibit such sidewise movement. The wall 80 also serves as a curtain or shield to limit the amount of dust, dirt and other contaminants that may come in contact with the resilient block 82.

From the foregoing description, it will be apparent that vibrations emanating from sources outside the scanner, for example from nearby rotating equipment or from trucks, trains or the like passing the vicinity of the building housing the scanner, will be isolated from the scanner by the resilient blocks 82 that support the scanner on the building floor. This, in turn, substantially alleviates image degradation during the operation of the scanner caused by such vibration.

It should be understood that although a particular permanent magnet type of scanner has been illustrated herein, the invention is also applicable to electromagnetic scanner constructions of both the resistive and superconducting electromagnet types, for example the apparatus disclosed in the aforesaid U.S. Pat. No. 4,766,378 to Danby et al.

It should further be understood that although a particular form of vibration isolating support has been illustrated herein, various changes in the details, materials, arrangements of parts, and operational conditions which have been herein described and illustrated in order to explain the nature of the invention may be made by those skilled in the art within the principles and scope of the invention. Moreover, although particular scanners illustrated herein are shown as being mounted within buildings, the invention is equally applicable to scanners mounted on other base structures. For example, the invention may be applied where the scanner is supported within a truck and the truck is supported on the ground. In such a case, vibration attenuation as discussed above may be interposed between the scanner frame and the structure of the truck, or else between the truck and the ground. As such changes and other variations and combinations of the features described above can be utilized without departing from the present invention as defined in the claims, the foregoing description of the preferred embodiments should be understood as illustrating, rather than as limiting, the invention as defined in the claims.

What is claimed is:

1. A medical NMR scanner comprising:
  (a) a frame,
  (b) means mounted to said frame for producing a magnetic field, said magnetic field producing means and said frame cooperatively defining a patient-receiving space adapted to receive a human body, said magnetic field producing means being operative to produce a magnetic field within said patient-receiving space; and,
  (c) means for applying radio frequency radiation and detecting nuclear magnetic resonance signals in said patient-receiving space; and (d) means for supporting said frame on a base structure and attenuating transmission of vibrations from the base structure to said frame and said magnetic field producing means in order to reduce scanner image degradation.

2. A scanner as claimed in claim 1, wherein said frame includes a pair of pole pieces, each of said pole pieces extending toward said patient-receiving space, said pole pieces defining a pair of polar regions.

3. A scanner as claimed in claim 2, wherein said frame comprises a ferromagnetic frame having a substantially continuous ferromagnetic flux return path extending between polar regions, said flux return path being remote from said patient-receiving space.

4. A scanner as claimed in claim 3, wherein said magnetic field producing means includes a first magnetic assembly adjacent one of said pole pieces and primary windings encircling said first magnetic assembly.

5. A scanner as claimed in claim 3, wherein said magnetic field producing means includes permanent magnets positioned adjacent of said pole pieces.

6. A scanner according to claim 1, wherein said means for supporting said frame and attenuating transmission of vibrations includes at least one attenuator, each said attenuator including a rigid bottom member having upper and lower surfaces and a resilient member positioned on said upper surface of said bottom member, said lower surface of said bottom member being adapted to rest on said base structure.

7. A scanner as claimed in claim 6, wherein said resilient member is fastened to said upper surface of said bottom member.

8. A scanner as claimed in claim 7, wherein said upper surface of said bottom member is generally planar in form, and wherein said resilient material comprises an elastomer block in the form of a truncated pyramid having planar upper and lower surfaces.

9. A scanner as claimed in claim 8, wherein each said attenuator further includes a metal top plate member having upper and lower surfaces thereon, said top plate member having its lower surface fastened to said top surface of said resilient member, the upper surface of said top plate member being adapted to fixedly support said frame thereon.

10. A scanner as claimed in claim 9, wherein said bottom member includes a tubular metal wall fixed to the upper surface thereof and surrounding said elastomer block over an elevation thereof greater than one-half but less than all of the height of said block.

11. A scanner as claimed in claim 10, wherein said elastomer block comprises a rubbery material having a Shore A hardness of about 70 durometer.

12. A scanner as claimed in claim 6, including a plurality of said attenuators positioned intermediate said frame and said base structure.

13. A scanner as claimed in claim 1, wherein said frame includes at least one ferromagnetic element, and said magnetic field producing means is adapted to direct magnetic flux through said frame so that magnetic flux passing through said frame contributes to the field in said patient-receiving space.

14. A scanner as claimed in claim 13, wherein said frame includes a plurality of ferromagnetic elements juxtaposed with one another, and said magnetic field producing means is adapted to direct magnetic flux through said juxtaposed elements.

15. A scanner as claimed in claim 14, wherein said magnetic field producing means includes at least one permanent magnet juxtaposed with said frame.

16. A scanner as claimed in claim 1, wherein said magnetic field producing means includes a plurality of permanent magnets juxtaposed with one another.

* * * * *

UNITED STATES PATENT AND TRADEMARK OFFICE
CERTIFICATE OF CORRECTION

PATENT NO. : 5,016,638

DATED : May 21, 1991

INVENTOR(S) : Hsieh

It is certified that error appears in the above-identified patent and that said Letters Patent is hereby corrected as shown below:

Column 4, line 40, "section" should read --sectional--.

Signed and Sealed this

Twenty-fourth Day of November, 1992

Attest:

DOUGLAS B. COMER

Attesting Officer

Acting Commissioner of Patents and Trademarks